United States Patent [19]

Aoki et al.

[11] 4,209,898
[45] Jul. 1, 1980

[54] ASSEMBLY LINE FOR PARTS OF ELECTRONIC AND OTHER EQUIPMENTS

[75] Inventors: Jun Aoki, Katsuta; Takashi Hayashida, Mito; Shigesabroh Komatu, Katsuta; Seii Miyakawa; Naoki Takahasi, both of Yokohama, all of Japan

[73] Assignee: Hitachi, Ltd., Japan

[21] Appl. No.: 940,353

[22] Filed: Sep. 7, 1978

[30] Foreign Application Priority Data

Sep. 12, 1977 [JP] Japan .................... 52-108840

[51] Int. Cl.² ............................................... B23P 21/00
[52] U.S. Cl. ....................................... 29/783; 29/701; 29/742; 29/784; 29/794
[58] Field of Search ................................. 29/701–704, 29/783, 784, 787, 791, 794–797, 742, 759

[56] References Cited

U.S. PATENT DOCUMENTS

Re. 25,886  10/1965  Cargill ...................... 29/791
3,722,062   3/1973   Gharaibeh ................ 29/783 X Primary Examiner—Carl E. Hall
Attorney, Agent, or Firm—Craig and Antonelli

[57] ABSTRACT

An assembly line for parts of electronic and other equipment having a plurality of assembling stations, each station including a conveyor belt for successively conveying articles from the adjacent station, a drive source for the conveyor belt, means for stopping each of the articles including a stop lever for engaging a boss attached to each article for stopping each article in an operating position, means for positioning each article including a positioning pin for insertion in a hole formed in each article for positioning the article stopped in the operating position, a picking and placing unit for assembling each part with one of the articles after parts are successively fed by a supplying device, and an assembly line base machine provided with an operating panel for operating the drive source, article stopping means, article positioning means and picking and placing unit. Shifting of the stations and reorganization of the assembly line itself can be readily carried out.

8 Claims, 9 Drawing Figures

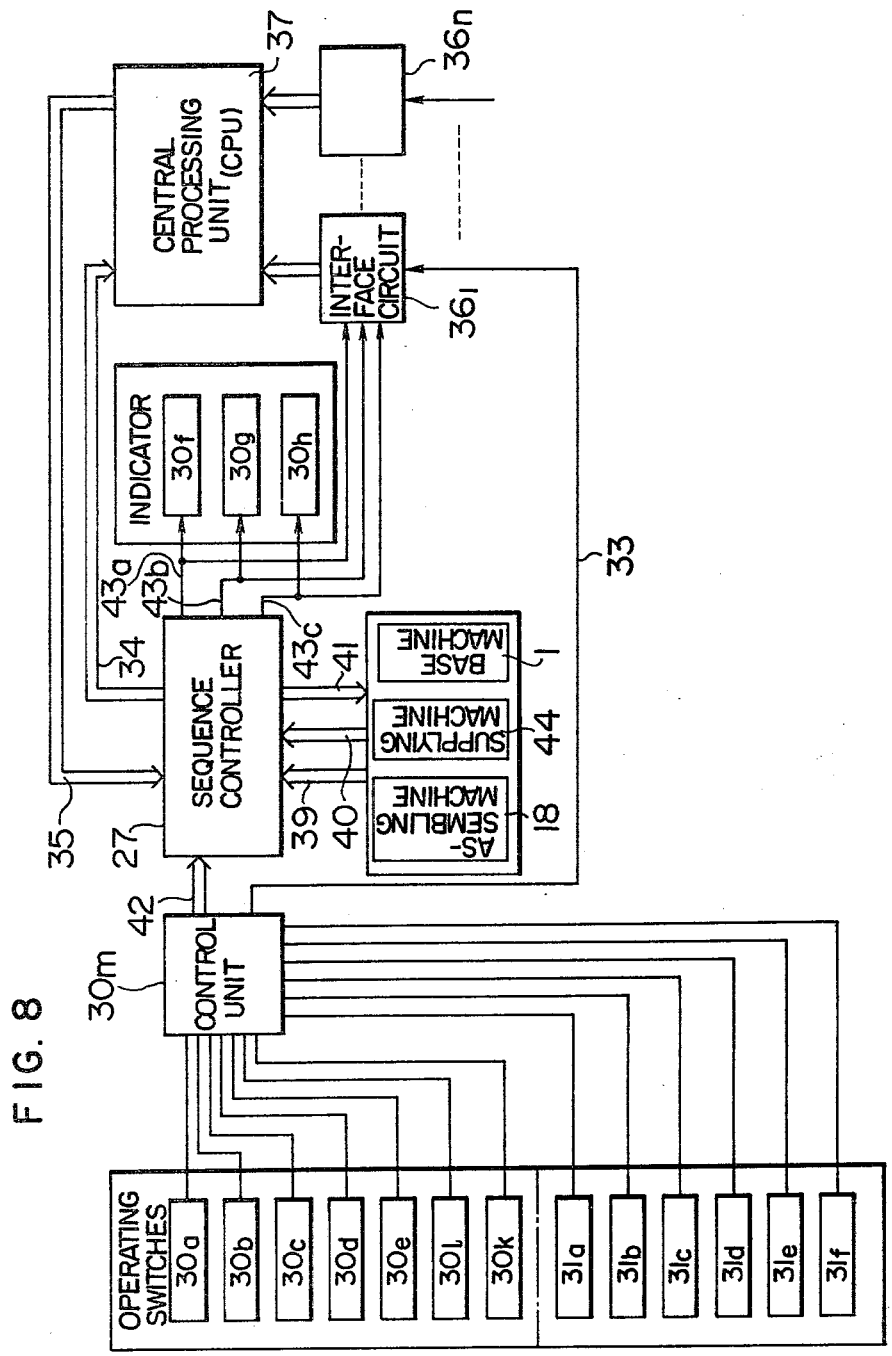

4,209,898

ASSEMBLY LINE FOR PARTS OF ELECTRONIC AND OTHER EQUIPMENTS

BACKGROUND OF THE INVENTION

This invention relates to an assembly line for parts of tape recorders, radios, etc., which are electronic or other equipment, wherein a multiplicity of parts are assembled into finished products.

Heretofore, a free cycle working line has been known which, as disclosed in U.S. Pat. No. Re 25,886, includes a chain conveyor for conveying parts and a drive source for the chain conveyor which are for all the working or assembling stations. Pallets which support workpieces thereon and conveyed by the chain conveyor are each stopped and positioned in each station, and each of the workpieces is worked by a working machine in each station. The free cycle working line of the prior art has a disadvantage in that, when trouble occurs in any of the working machines mounted in the stations or the chain conveyor or the drive source fails, operation must be suspended in the entire working line, thereby causing a great reduction in the rate of operation. Particularly, when a single free cycle working line has several scores of stations, the chain conveyor must be stopped often and the operation must be suspended in the entire working line, if a failure occurs in the connection between the chain conveyor and the working machine in any of the stations. Thus, this type of working line has been very low in the rate of operation.

SUMMARY OF THE INVENTION

This invention has as its object the provision of an assembly line for parts of electronic and other equipment wherein operation can be continued without interruption in the entire working line, even if trouble occurs in any one of the stations.

The characterizing features of this invention are that the assembly line includes a plurality of tables, one for each station, and each table has mounted thereon a guide rail extending across the surface of the table, an endless conveyor mounted along the guide rail for successively conveying articles by frictional engagement of the articles with the conveyor by the weight of the articles while a boss or a groove formed in a lower end of each article is fitted in a guide rail to be guided thereby a drive source for driving the endless conveyor, article stopping means including a stop lever located in an operating position in each station for engaging a member projecting from each article to stop each article in the operating position, article positioning means including a positioning pin located in the operating position for insertion into a hole formed in each article to correctly position each article in the operating position, and an operating unit for executing a predetermined operation with each article stopped and positioned in the operating position by the article stopping means and the article positioning means respectively. A sequence controller for effecting control of a series of operations performed by various means and operating unit is provided for each station, whereby operation can be performed independently in each station in the assembly line and shifting of the stations and reorganization of the assembly line itself can be carried out readily.

BRIEF DESCRIPTION OF THE DRAWINGS

FIG. 8 shows the outline of operation of a unit for controlling the assembling machine, supplying machine and base machine of each assembling station.

DESCRIPTION OF THE PREFERRED EMBODIMENT

Figure 1:
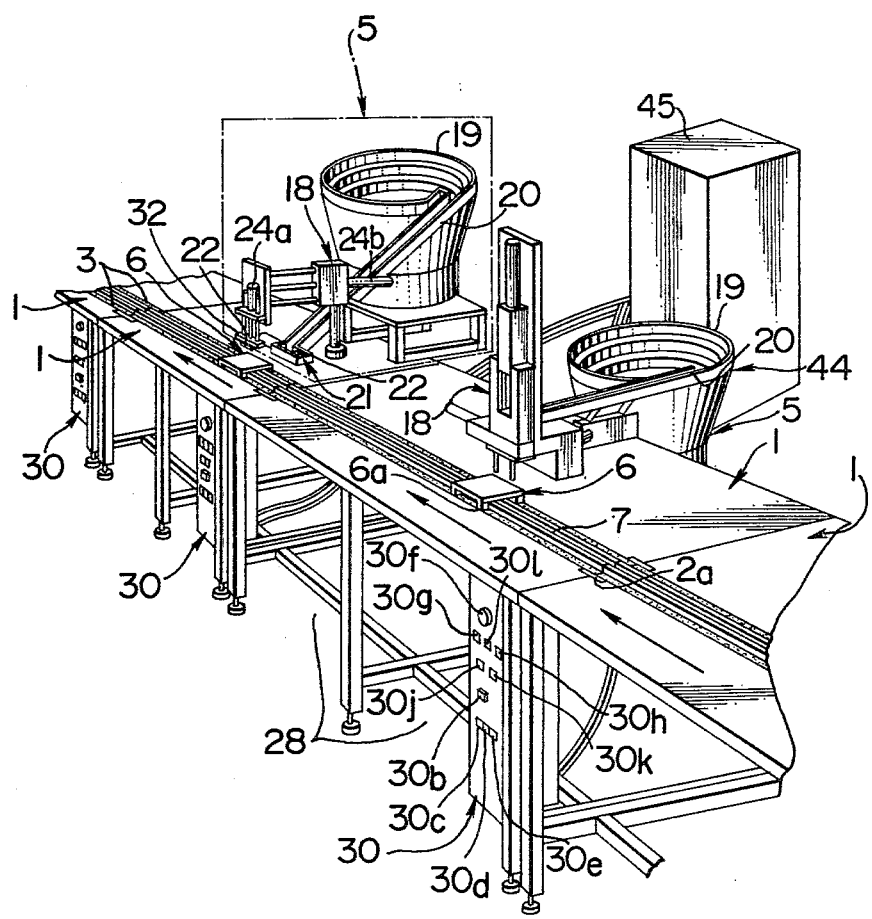
FIG. 1 is a fragmentary perspective view of the assembly line for parts of electronic and other equipments according to this invention.

FIG. 1 is a perspective view partly showing the assembly line for parts of electronic and other equipments according to this invention. An article 6 may be, for example, an electronic equipment, such as a tape recorder, and the parts assembled comprise various types of operating parts, various types of links, various types of pivotal arms, various types of rotating members, various types of springs, various types of belts, a head assembly, switching mechanisms and balls. The assembly line for assembling the article 6 has 30–60 assembling stations arranged, for example, in the form of a letter U and including a station in which a chassis is placed on a conveyor, a station in which each of the aforesaid various parts is assembled with the chassis, a station in which a screw tightening operation is performed and other stations for performing various different operations.

Figure 2A:
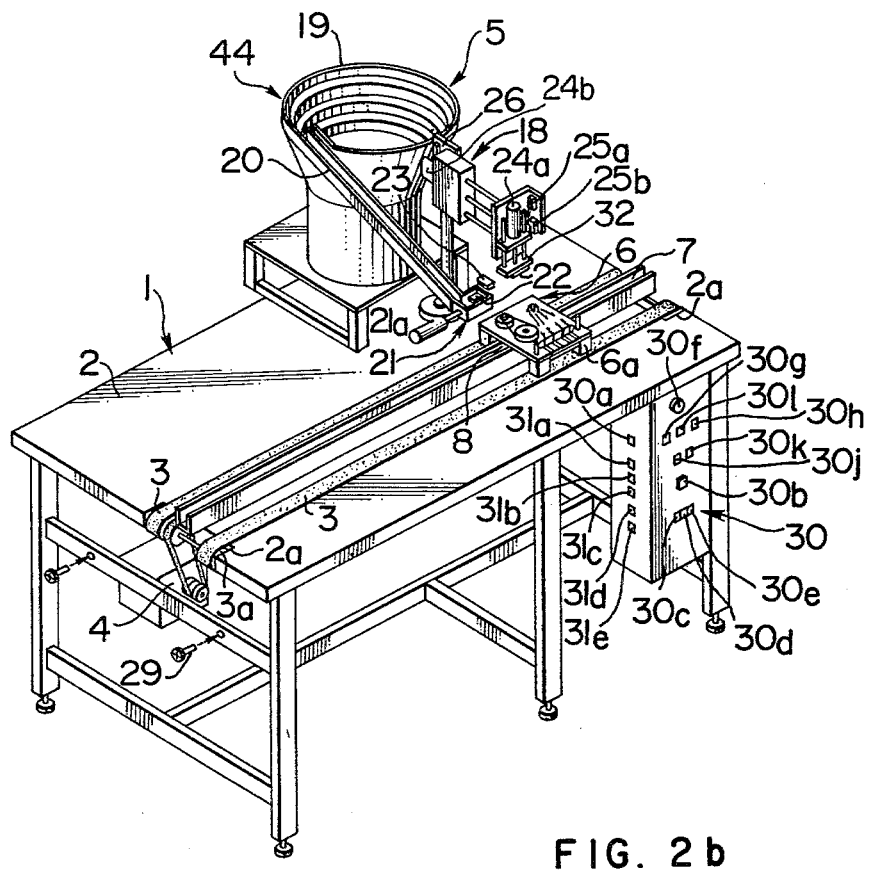
FIG. 2a is a perspective view, on an enlarged scale, of one of the assembling stations shown in FIG. 1.

Each station of the assembly line includes a base machine 1 having the function of conveying, stopping and positioning the article 6 and capable of being used in any of all the stations, a part supplying and assembling section 5 corresponding to the base machine 1 for effecting aligning, feeding, separation and assembling of parts, and an operating panel 30 for controlling these operations and giving indications. One sequence control device 45 is provided for several stations. In the sequence control device 45, there are provided several sequence controllers 27 which are associated with one for each station for effecting sequence control of a series of operations performed in said each station. The base machines 1 of these independent stations are successively connected one to another simply by means of two bolts 29 shown in FIG. 2a. The base machine 1 constituting each assembling station includes a rectangular table 2. 3 designates a conveyor belt for conveying the article 6 by being maintained, by the weight of the article 6, in engagement with four ribs 6a projecting from the underside of the article 6. The conveyor belt 3 consists of two belt members located parallel to each other and trained over pulleys 3a rotatably mounted in cutouts 2a formed at opposite ends of the table 2. 4 designates a motor mounted on the lower left side of the table 2 for driving the pulleys 3a.

7 designates a guide rail in the form of a groove of the U-shape in cross section for guiding bosses 11 and 12 attached to the article 6. The guide rail 7 extends from the left end to the right end of the surface of the table 2 and is interposed between the belt members of the conveyor belt 3.

Figure 3:
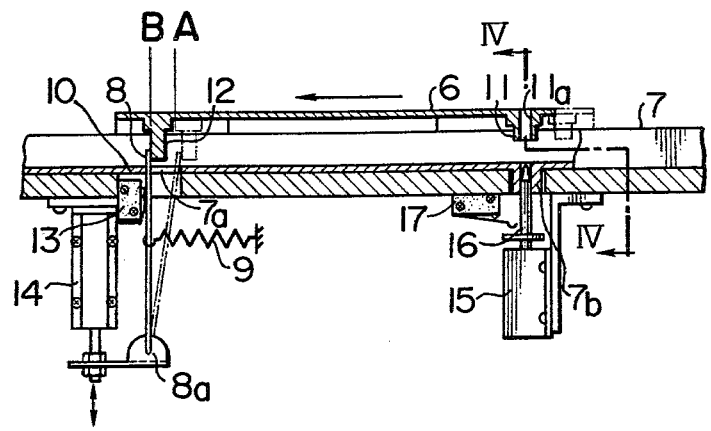
FIG. 3 is a front view, partly shown in section, of the article stopping means and the article positioning means of the assembly line shown in FIG. 1.
Figure 4:
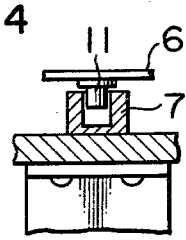
FIG. 4 is a sectional view taken along the line IV—IV in FIG. 3; showing the relation between a portion of an article and the guide rail.

Referring to FIG. 3, 8 designates a stop lever adapted to come into engagement with the front of the boss 12 of the greater length attached to a leading end portion of the article 6. The stop lever 8 is pivotally supported at 8a for movement in an opening 7a formed in a predetermined position in the guide rail 7 and normally urged to move clockwise by the biasing force of a spring 9. 13 designates a first switch mounted on the underside of the guide rail 7 for detecting the contact of the stop lever 8 with a stopper surface 10 of the opening 7a and the stopping of the article 6 in an assembling position (operating position) of each assembling station. 14 designates a stopper cylinder mounted on the underside of the table 2 for vertically moving in reciprocatory movement a plate for supporting the pivot 8a of the stop lever 8. 15 is a positioning cylinder mounted on the underside of the table 2 and having an output shaft located vertically and connected to a positioning pin 16 having a pointed forward end for projection through an opening formed in a guide bush 7b attached to a predetermined position in the guide rail 7 to be inserted in a hole 11a formed in the boss 11 of the article 6, so as to position the article 6 in the assembling position (operating position) by using the guide bush 7b as a reference. 17 is a second switch mounted on the underside of the table 2 for detecting that the positioning pin 16 has moved upwardly to correctly position the article 6, the second switch 17 having an actuating arm adapted to come into engagement with a projection formed in the positioning pin 16.

Figure 2B:
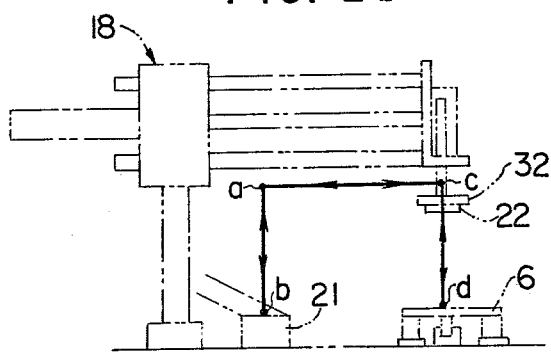
FIG. 2b is an explanatory view showing the path of movement of a chuck holding the parts which is provided in a picking and placing unit.

Referring to FIG. 2, 19 designates a parts feeder storing therein a large number of parts 22 to be assembled with the article 6, the parts feeder 19 successively aligning the parts 22 serially and feeding them by vibration to a straight line feeder or a gravity chute 20. 21 designates a separating section in which the parts 22 are successively separated from one another, after they are moved straight forwardly by vibration through the straight line feeder or fed by gravity while remaining in an inclined position. In the separating section 21, a pawl which has engaged and restrained the foremost part 22 of the group of parts 22 is disengaged to release the first part 22, and the next following part 22 is held in position as by the pressure of a spring, so that the parts 22 will be successively separated from one another and the separated part 22 will be positioned, by being forced by a cylinder 21a, against a reference wall (reference position) in a portion which is in the form of a groove. 23 is a third switch for detecting that the part 22 is positioned in the reference position.

18 designates a picking and placing unit, serving as an assembling machine, which is mounted on the table 2 and which has attached to its forward end a chuck 32 having a pin inserted in a reference hole (not shown) formed in the part 22 positioned in the separating section 21. The chuck 32 grips the part 22 by electromagnetic or vacuum adhesion to move it from the reference position in the separating section 21 to an assembling position in the article 6. The chuck 32 is moved up and down in a predetermined amount by means of a cylinder 24a, and is moved back and forth a predetermined amount by means of a cylinder 24b, so that the part 22 will be conveyed through a path in the form of a portal. 25a is a switch for detecting the upper limit of the chuck 32, while 25b is a switch for detecting the lower limit of the chuck 32. 26 is a switch for detecting that the chuck 32 has held the part 22 and is positioned in a front end of the assembling position.

30 designates an operating panel for effecting control of operation of the base machine 1 for each assembling station. The control panel 30 has mounted thereon a centralized/individual change-over switch 30a for switching between a centralized automatic operation of all the base machines 1 of the number of assembling stations and an individual operation of the single base machine 1 of one assembling station, an automatic/manual change-over switch 30b for switching between an automatic operation and a manual operation, an automatic starting switch 30c which is actuated when it is desired to perform an individual automatic operation, a base machine switch 30d which is actuated when it is desired to perform an individual operation to allow only the motor 4 to be driven so as to continuously convey the articles 6 from the right end to the left end, without operating the parts feeder 19, a supplying machine 44 including the straight line feeder or the chute 20, the assembling machine 18, the positioning cylinder 15, and the stopper cylinder 14, a one cycle switch 30e which enables the supplying machine 44, the assembling machine 18, and the article conveying and positioning means (the motor 4, positioning cylinder 15, and stopper cylinder 14) through one cycle only, an emergency stop switch 30l which renders all the mechanisms inoperative in case of emergency, an emergency suspension indication lamp 30f for indicating that all the operations are suspended in case of emergency, an abnormal assembling indication lamp 30g for indicating that the assembling machine 18 is in trouble, an abnormal supply indication lamp 30h for indicating that the parts feeder 19 and the supplying machine 44 including the straight line feeder or gravity chute 20 are in trouble, a button 30j for checking the lamps, and a reset button 30k for putting out the aforesaid lamps. 31a is a switch for driving the motor 4 only. 31b is a switch for driving the stopper cylinder 14 only. 31c is a switch for driving the positioning cylinder 15. 31d is a switch for driving the cylinder 24b for moving the chuck 32 of the picking and placing unit 18 back and forth. 31e is a switch for driving the cylinder 24a for moving the chuck 32 of the picking and placing unit 18 up and down. Besides, there are provided a switch for driving the parts feeder 19, and a switch 31f for driving the cylinder for positioning the part 22 in the reference position. These switches are designed to actuate, individually and manually, the drive for each of the supplying machine 44, the assembling machine 18 and the article conveying and positioning means.

However, when all the stations are operating normally, no abnormal signal 34 is produced by the sequence controller 27 of each station, so that the assembly line is ready for centralized operation. Thus, by setting the centralized/individual change-over switch 30a at the centralized operation, a control unit 30m mounted in the operating unit 30 produces a centralized automatic operation signal 33 which is supplied, through an interface circuit 36₁, to a central processing unit (CPU) 37. The central processing unit 37 in turn supplies a sequence start signal 35 to the sequence controllers 27 of all the assembling stations. Thus, the parts supplying machine 44 is actuated to start operation and the motor 4 of the base machine 1 is actuated too, so that the supplying machine, the assembling machine and the all the cylinders of the base machine are operated in sequence in all the assembling stations. In this way, operations are executed in many assembling stations while the operations are centrally controlled by means of a computer.

Figure 5:
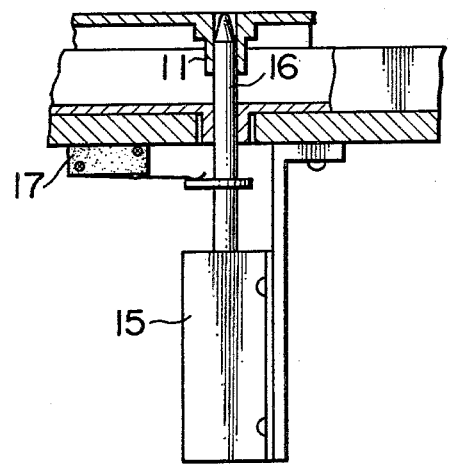
FIG. 5 is a view, partly shown in section, showing the manner in which an article is positioned by inserting the positioning pin in a hole formed in the article.
Figure 6:
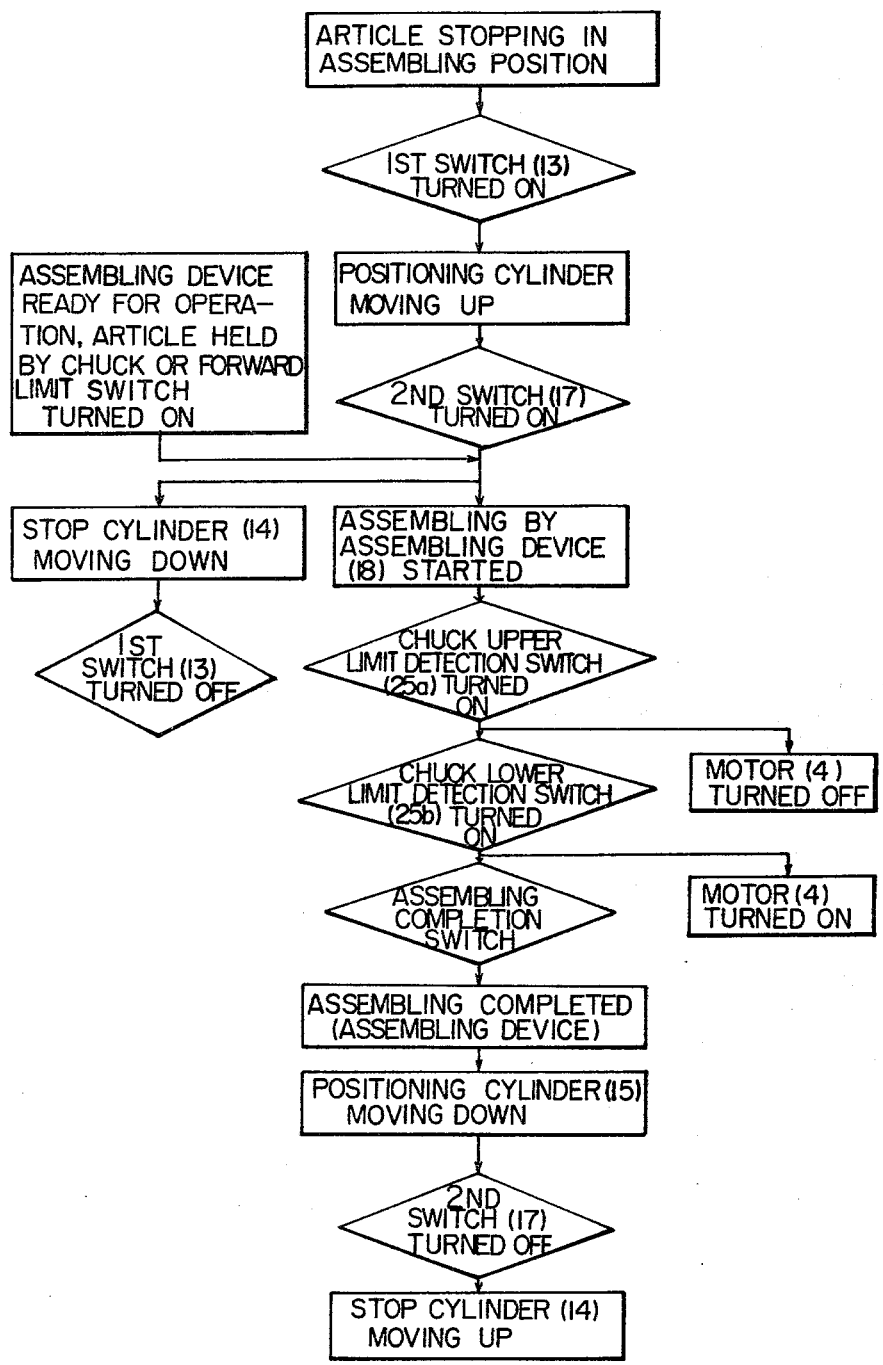
FIG. 6 is a flow chart for assembling parts with an article.

The operation of the assembling stations will now be described. The motor 4 is actuated to drive the conveyor belt 3 and the article 6 which is supported on the conveyor belt with its ribs 6s being in engagement with the conveyor belt 3. The article 6 moves in the direction of an arrow shown in FIG. 1 while being guided by the guide rail 7 which has inserted in its groove the bosses 11 and 12 of the article 6. As shown in FIG. 3, the bosses 11 and 12 have their lengths set beforehand in such a manner that the boss 11 does not impinge on the stop lever 8 and the boss 12 impinges on the stop lever 8. When the article 6 conveyed from the previous station reaches the illustrated assembling position, the boss 12 attached to the article 6 causes the stop lever 8 disposed in a position A to move to a position B, against the biasing force of the spring 9, in which the stop lever 8 abuts against the stopper surface 10 and becomes stationary. And, as shown in FIG. 6, the arrival of the article 6 at the predetermined position is detected by the first switch 13 which produces a limit switch signal 39 and supplies the same to the sequence controller 27, which in turn produces and supplies a drive signal 41 to the positioning cylinder 15 to actuate the latter. Thus, the positioning pin 16 is moved upwardly as shown in FIG. 5. The article 6 can be correctly positioned as the positioning pin 16 of the positioning cylinder 15 is fitted in the hole in the boss 11 of the article 6. Upon the article 6 being thus positioned, the second switch 17 detects this positioning, and a drive signal 41 from the sequence controller 27 actuates the stopper cylinder 14 to move the stop lever 5 downwardly. Upon the stop lever 8 being released from engagement with the boss 12 attached to the article 6, the stop lever 8 is restored to its original broken line position by the biasing force of the spring 9 while remaining in its lower position. Meanwhile the second switch 17 produces and applies a limit switch signal 39 to the sequence controller 27 to actuate the same, with the result that the sequence controller 27 is actuated to give the drive instructions 41 to the assembling machine 18. Thus the picking and placing unit 18 begins to assemble the part 22 with the article 6.

The flow of the parts 22 to be assembled with the articles 6 will be described. The parts stored in the parts feeder 19 are aligned in a predetermined direction. The aligned parts are transferred to the chute 20 where they remain stationary. One part which is necessary is separated from the parts in the separating section 21 which is located posterior to the chute 20. The separated part 22 is moved by the picking and placing unit 18 to the assembling position where it is assembled with the article 6. The movement of the chuck 32 provided in the picking and placing unit 18 completes one cycle when it has moved through a-b-a-c-d-c-a points shown in FIG. 2b. Point a is the starting point. The third switch 23 for separation detects that the part 22 is located in the reference position in the separating section 21 and causes the chuck 32 of the picking and placing unit 18 to move from starting point a to point b, so that the reference pin extending from the chuck 32 will be inserted in the reference hole formed in the part 22 to enable the chuck 32 to hold the part 22 by electromagnetic or vacuum adhesion. Then, the chuck 32 is moved upwardly by the cylinder 24a for moving the chuck 32 up and down and moved forwardly by the cylinder 24b for moving the chuck 32 back and forth, so that the chuck 32 of the picking and placing unit 18 holding the part 22 waits, at point c, for the article 6 to be conveyed to the assembling position. When the switch 25 detects that the chuck 32 holding the part 22 is located in the forward position and the second switch 17 detects that the article 6 is positioned in the assembling position, the cylinder 24a for moving the chuck 32 up and down is actuated, so that the chuck 32 will continue its movement from point c to point d and the motor 4 will be rendered inoperative. As the chuck 32 releases the part 22 at point d, the part 22 is assembled with the article 6. At this time, the part 22 to be assembled moves downwardly while being guided by the reference pin of the chuck 32 when the part 22 is placed on the article 6. If the part 22 is assembled in a correct position, this is detected by a photoelectric detecting means mounted at the forward end of the chuck 32 and consisting of a light source and a light receiving element or by an electrically conducted detecting means including a brush-like member mounted in a predetermined position for electrically conducting the assembled part 22, thereby completing assembling.

The motor 4 may be driven by a signal from a switch for detecting the completion of assembling or the switch 25b for detecting the lower limit of the picking and placing unit 18. The chuck 32 of the picking and placing unit 18 then moves through points d, c and a to wait at point a for the next part 22 to be supplied to the separating section 21. When the switch for detecting the completion of assembling of the part 22 with the article 6 by means of the picking and placing unit 18 produces a signal, the signal is supplied to the positioning cylinder 15 to move the positioning pin downwardly to its original position. Downward movement of the positioning pin 16 actuates the stopper switch 17 and the stopper cylinder 14. At the same time, the stop lever 8 is completely restored to its original broken line position. The motor 4 also drives the conveyor belt 3 to convey the article 6 to the next following station. The aforementioned cycle of operations is repeatedly performed to assemble the part 22 with each article 6. The sequence controller 27 is used for controlling the aforesaid series of operations. The operating panel 30 for controlling these operations is arranged in each station. According to one embodiment of the operating panel 30, the base machine switch 30d is intended only for moving the conveyor belt 3 and is actuated when the picking and placing unit 18 is in trouble or under repair, and assembling of the parts 22 with the articles 6 is carried out manually, so that the articles 6 will be conveyed to the next following station independently of the picking and placing unit 18. As shown in FIG. 1, a manual operation space 28 is provided in each station to accommodate the legs of the operator and to enable the operator to perform operations with ease while sitting or squatting on the floor. A space is formed on the table 2 for placing magazines for storing a large number of parts therein. Thus, even if the parts supplying machine 44 or picking and placing unit 18 fails, the belt 3 can be only driven and assembling of the parts 22 with the articles 6 can be executed manually by setting the centralized/individual changeover switch 30a at an individual operation, by setting the automatic/manual change-over switch 30b at an automatic operation and by actuating the base machine switch 30d to only move the belt 3.

Figure 7:
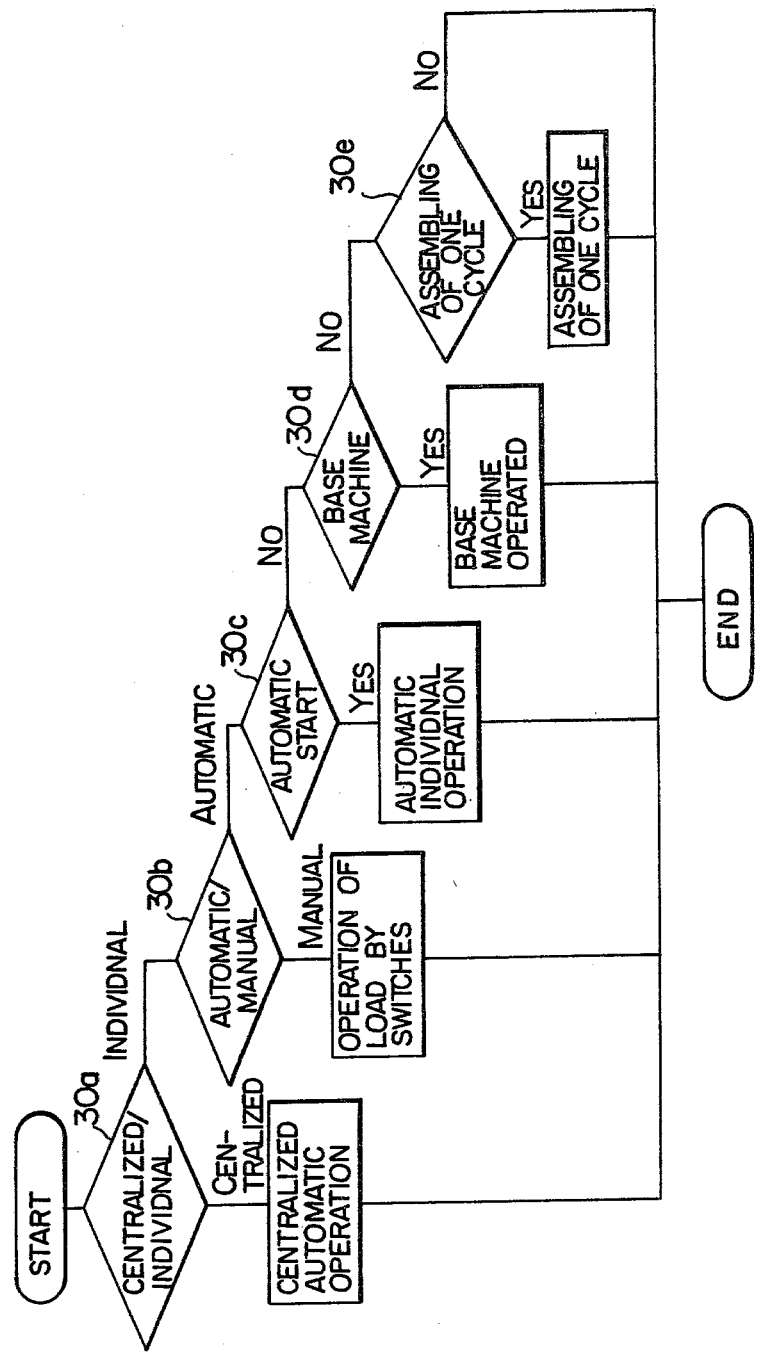
FIG. 7 is a flow chart showing operations performed by actuating switches mounted on the operating panel shown in FIGS. 1 and 2.

As aforesaid, the adjacent two assembling stations are interconnected by the two bolts 29. Thus, by releasing the two bolts 29, it is possible to rearrange the stations. Also, if the base machine 1 operates normally as shown in FIG. 7, the limit switch signal 39 of the picking and placing unit 18, the supplying machine 44 and the base machine 1 of each station operates normally. Supply of the part, holding of the part by the chuck, and assembling of the part with the article are detected as by a photoelectric detecting means and a signal 40 is produced when there is no abnormality. No abnormal signals 43a, 43b and 43c (FIG. 8) are not supplied to the interface circuit $36_1$. At this time, if the centralized/individual change-over switch 30a is set at a centralized operation, all the sequence controllers 27 are actuated by instructions from the central processing unit 37 and the conditions of all the stations are indicated on an indication panel of the central processing unit 37, so that the operation can be performed by centralized control.

When it is impossible to place all the assembling stations under centralized control, the centralized/individual change-over switch 30a is set at an individual operation and, if the station of interest is normal, the automatic/manual change-over switch 30b is set at an automatic operation and the automatic start switch 30c is turned on, so as to supply an operating signal 42 (See FIG. 8) from the control unit 30m to the sequence controller 27. Thus, the operations can be performed individually and automatically in this station and automatic assembling of the part with the article can be performed. Also, when jamming of the parts, misoperation of the chuck in gripping the part or other trouble occurs in a certain station, it is possible to operate the drive source (load) of the portion, which has failed, by means of any one of the signals 31a to 30f to effect repair immediately and restore normalcy, by setting the automatic/manual change-over switch 30a at a manual operation. When normalcy is restored, the automatic/manual change-over switch 30a is set at an automatic operation. When the station is thus switched from a manual operation to an automatic operation, it is possible to ascertain whether the station operates normally, by turning on the one cycle assemble switch 30e so as to automatically carry out assembling of the part through one cycle. The control unit 30m comprises a circuit for shaping the signals from the switches 30a to 30e, 30l, 30k and 31a to 31f for introduction into the sequence controller 27.

In the embodiment shown and described hereinabove, the article 6 is guided by the guide rail 7 by means of the bosses 11 and 12 attached to the underside of the article 6 and fitted in the groove in the guide rail 7. It is to be understood that the invention is not limited to this arrangement, and that the article 6 can be guided by the guide rail which is in the form of an elongated bar and received in a groove formed on the underside of the article 6.

From the foregoing description, it will be appreciated that the invention makes it possible to alternately perform an automatic assembling operation by using a picking and placing unit and a manual assembling operation in each assembling station of an assembly line. By this feature, the invention enables the operating rate of the assembly line to be greatly increased, because the operation can be switched instantanously from automatic to manual in a certain station in which the source of trouble in the supplying machine and picking and placing unit can be readily removed or the supplying machine and picking and placing unit are not fit for use because of an alteration made in the parts handled, without suspending operation not only in the adjacent two assembling stations but also in all the stations in the line.

According to the invention, the base machine of each station can be readily replaced by another base machine which has been placed in reserve, in case trouble occurs in the base machine or the supplying machine and the picking and placing unit, which require adjustments of their positions in the station relative to the base machine, cannot readily be repaired on the spot. Thus, little influence is exerted on the assembling stations adjacent the station in which trouble has occurred in the base machine, thereby enabling to minimize a reduction in the rate of operation.

According to the invention, it is possible to let each station operate independently of other stations. By virtue of this feature, if the operator is assigned to a station in trouble, assembling of parts with the articles and repair and adjustments of the mechanisms can be carried out simultaneously, thereby minimizing influences which would be exerted on the adjacent stations or the assembly line in general.

According to the invention, the stations of the assembly line are independent of one another and the base machine has versatility. This feature enables reorganization of the assembly line to be effected readily without forming a new line when there is a change in the model of the products to be handled. Thus, a new assembly line suitable for products of a new model can be readily organized with low cost, so that the assembly line according to the invention has very great economical effects.

The table of the stations of the assembly line according to the invention can be freely connected or disconnected. When the tables are connected, the guide rails of the tables can be brought into alignment with one another. This is also the case with the conveyor belts, so that articles can be conveyed on the conveyor belts from one station to another without let or hindrance.

We claim:

1. An assembly line for parts of electronic and other equipment having a plurality of assembling stations for carrying out a plurality of production steps, said assembly line comprising:
a table assigned to each one of said plurality of assembling stations and each table having mounted thereon:
 (a) endless conveyor means mounted on an upper surface of the table across thereof and movable from one end to the other end of the table;
 (b) a drive source for driving said endless conveyor means;
 (c) stopping means comprising a stop lever for engaging an article conveyed by said endless conveyor means to stop the article in an operating position;
 (d) positioning means comprising a positioning pin for insertion in a hole formed in said article stopped by said stopping means in the operating station so as to thereby engage the article and correctly position the same in the operating position; and (e) operating means for performing an operation with the article positioned in the operating position in accordance with a predetermined schedule; and a sequence controller provided for each of said assembling stations for effecting sequence control of a series of operations performed by various elements in each station including actuating said stopping means and said positioning means to stop and position in said operating position an article supplied by said endless conveyor means across said table, actuating said operating means to perform a predetermined operation with said article, and releasing said positioning means to convey the article again by said endless conveyor means upon completion of the performance of the operation;

said tables and said sequence controllers in said plurality of assembling stations capable of being arranged in any combination as desired to provide an assembly line suitable for performing a plurality of different assembling operations.

2. An assembly line as claimed in claim 1, further comprising switches mounted at each table for producing signals for rendering said sequence controller operative and inoperative.

3. An assembly line as claimed in claim 1, further comprising a plurality of lamps mounted at each table for indicating the misoperation of said operating means, said stopping means and said positioning means.

4. An assembly line as claimed in any one of claims 1, 2 and 3, wherein said endless conveyor means comprises at least two endless conveyor belts arranged parallel to each other, said endless conveyor belts being brought into frictional engagement with ribs formed on the underside of each article for conveying the article as the belts move.

5. An assembly line as claimed in claim 4, further comprising guide rail means arranged to cross the table from one end thereof to the other end thereof and interposed between said two endless belts of said endless conveyor means in parallel therewith, said guide rail means being brought into engagement with one of a boss and a groove formed on the underside of each article whereby said guide rail means can guide the article as the latter is conveyed by the endless conveyor means from one end of the table to the other end thereof.

6. An assembly line as claimed in any one of claims 1 to 3, wherein said operating means comprises a supplying machine for successively aligning and feeding a number of parts to cause each part to be positioned in a predetermined position, and a picking and placing unit for holding the part positioned in said predetermined position in the supplying machine and assembling the part with the article stopped and positioned in the operating position, said supplying machine and said picking and placing unit being adapted to be rendered operative by instructions from said sequence controller.

7. An assembly line as claimed in claim 4, wherein said operating means comprises a supplying machine for successively aligning and feeding a number of parts to cause each part to be positioned in a predetermined position, and a picking and placing unit for holding the part positioned in said predetermined position in the supplying machine and assembling the part with the article stopped and positioned in the operating position, said supplying machine and said picking and placing unit being adapted to be rendered operative by instructions from said sequence controller.

8. An assembly line as claimed in claim 5, wherein said operating means comprises a supplying machine for successively aligning and feeding a number of parts to cause each part to be positioned in a predetermined position, and a picking and placing unit for holding the part positioned in said predetermined position in the supplying machine and assembling the part with the article stopped and positioned in the operating position, said supplying machine and said picking and placing unit being adapted to be rendered operative by instructions from said sequence controller.

* * * * *